United States Patent [19]

Usui et al.

[11] Patent Number: 4,806,876
[45] Date of Patent: Feb. 21, 1989

[54] HIGH FREQUENCY AMPLIFIER CIRCUIT

[75] Inventors: Akira Usui, Osaka; Seiji Sakashita, Kyoto; Kiyotake Fukui; Hiroyuki Nagai, both of Osaka, all of Japan

[73] Assignee: Matsushita Electric Industrial Co., Ltd., Japan

[21] Appl. No.: 99,001

[22] Filed: Sep. 21, 1987

[30] Foreign Application Priority Data

Sep. 19, 1986 [JP] Japan .................................. 61-223094

[51] Int. Cl.$^4$ .............................................. H03G 3/10
[52] U.S. Cl. ...................................... 330/279; 330/284
[58] Field of Search ................. 330/277, 278, 279, 284

[56] References Cited

U.S. PATENT DOCUMENTS 4,057,765 11/1977 Schuermann ...................... 330/284

Primary Examiner—Gene Wan
Attorney, Agent, or Firm—Lowe, Price, LeBlanc, Becker & Shur

[57] ABSTRACT

A high frequency amplifier circuit based on an amplifying transistor, e.g. a dual-gate FET, having an A.G.C. voltage applied to a control terminal thereof to control the transistor DC operating current, has a diode connected between an input electrode of the transistor and a source of an input high frequency signal. All or part of the DC operating current of the transistor is passed through the diode as the operating current of the diode to thereby produce a high degree of attenuation by the diode when the transistor current level is small, so that reduced cross modulation interference is produced by the transistor when a high degree of gain reduction is executed by A.G.C. control.

6 Claims, 4 Drawing Sheets

HIGH FREQUENCY AMPLIFIER CIRCUIT

BACKGROUND OF THE INVENTION

The present invention relates to a high frequency amplifier circuit which is capable of a wide range of gain control.

In recent years, together with developments which have been made in "new media" apparatus such as CATV, etc., requirements have arisen for high frequency amplifier circuits having enhanced performance. An example of a prior art high frequency amplifier circuit will be described referring to FIGS. 1 and 2 of the drawings. FIG. 1 is a circuit diagram of an example of a prior art high frequency amplifier circuit, while FIG. 2 shows a typical characteristic of gain reduction with respect to cross modulation for such a circuit. In FIG. 1 numeral 8 denotes a dual-gate FET (field effect transistor) which is designed for high-frequency operation, 14, 9 and 4 are by-pass capacitors each having a large value of capacitance (e.g. 1,000 to 2,000 pf). Numeral 6 denotes a feedback capacitor, 16 a feedback resistor, 13 and 10 denote bias resistors, 7 a zener diode and 5 denotes a choke coil serving as a load. Numeral 1A denotes a high frequency signal input terminal, 1B an A.G.C. (automatic gain control) voltage input terminal, 1C denotes a high frequency signal output terminal, 1D a first power supply terminal and 1E a second power supply terminal.

The operation of this prior art high frequency amplifier circuit is as follows. A high frequency input signal is transferred from the input terminal 1A through the capacitor 11 to the first gate electrode $G_1$ of the FET 8. A DC current flows from the source electrode S of the FET 8 through the resistor 12 to then flow through the zener diode 7. A fixed voltage thereby appears at the cathode of the zener diode 7 which is applied through the resistor 13 to the first gate electrode $G_1$ of the FET 8. A feedback circuit consisting of the resistor 16 in series with the feedback capacitor 6 is connected between the drain electrode D and the first gate electrode $G_1$ of FET 8, to ensure uniform amplification over a wide frequency range. The drain electrode D is coupled to receive a supply voltage $V_1$ which is supplied through the choke coil 5, while the high frequency output signal that is produced from the drain electrode D is coupled through the capacitor 4 to the output terminal 1C, to be supplied to a succeeding circuit stage. An A.G.C. voltage is supplied from the A.G.C. voltage input terminal 1B to the second gate electrode $G_2$ of FET 8, to control the circuit gain.

The gain reduction/cross modulation characteristic of this circuit is indicated as curve 9B in FIG. 2, in which amounts of gain reduction (i.e. resulting from application of the A.G.C. voltage) are plotted along the horizontal axis, while cross modulation rejection is plotted along the vertical axis. It is assumed that point 9C in FIG. 2 corresponds to the A.G.C. delay point, i.e. the point at which A.G.C. operation begins. By drawing a line from point 9C at an angle of 45°, as shown, a point of intersection 9A is obtained with the cross modulation characteristic curve 9B. This point 9A corresponds to a condition whereby any further increase in gain control (i.e. increased degree of gain reduction by application of A.G.C.) will result in interference being produced by an interfering signal whose level is identical to that of the desired signal.

It will thus be apparent that with a prior art high frequency amplifier circuit of the form described above, severe cross-modulation effects are produced when the degree of gain reduction effected by A.G.C. control exceeds a certain value.

SUMMARY OF THE INVENTION

It is an objective of the present invention to overcome the disadvantage of the prior art described above, by providing a high frequency amplifier circuit whereby a high degree of cross modulation rejection is attained even when a substantially large amount of gain reduction is being produced by application of A.G.C. In order to achieve the above objective, a high frequency amplifier circuit according to the present invention includes, in addition to a reverse A.G.C. circuit whereby the gain of an amplifier transistor is controlled by varying a level of DC operating current through the transistor, a diode which is connected to produce varying degrees of signal attenuation by variation of a DC current flow therethrough, which is connected between an input electrode of the amplifier transistor and an input signal source, the diode being connected such that variation of the operating current of the transistor results in a simultaneous change in the DC current flow through the diode and a consequent change in a degree of signal attenuation produced by the diode. Gain control by variation of the DC current through the diode and gain control by variation of the DC current through the transistor are thereby achieved simultaneously.

With a high frequency amplifier circuit having the above configuration, an initial stage of gain control (for example reduction of gain by an amount which is in the range 0 to 10 dB) is mainly executed by variation of the operating DC current of the amplifying transistor. When gain reduction exceeds a certain amount (for example 10 dB), then any further reduction is mainly achieved by controlling the DC current flow through the diode. The level of cross modulation rejection of the diode can be held to approximately 110 dB, so that good performance with respect to cross modulation is attained. In addition when the DC operating current of the transistor is small, the level of the high frequency signal which is supplied to the transistor is also small, due to the attenuation which is produced by the diode, so that cross modulation resulting from the transistor operation is held to a very low level. For these reasons, a substantial improvement is attained in the cross modulation performance with respect to A.G.C. operation.

DESCRIPTION OF PREFERRED EMBODIMENTS

Figure 3:
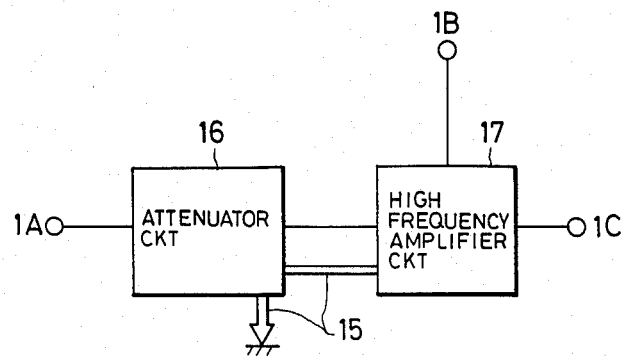
FIG. 3 is a block circuit diagram for assistance in describing the basic principles of a high frequency amplifier circuit according to the present invention.

Embodiments of high frequency amplifier circuits according to the present invention will be described in the following, referring to the drawings. FIG. 3 shows the basic configuration of a high frequency amplifier circuit according to the present invention. In FIG. 3, numeral 16 denotes an attenuator circuit which includes a diode, 17 denotes a high frequency amplifier circuit which includes a transistor, 15 denotes a DC operating current path, 1A denotes a high frequency signal input terminal, 1B denotes an A.G.C. voltage input terminal, and 1C denotes a high frequency signal output terminal.

Figure 4:
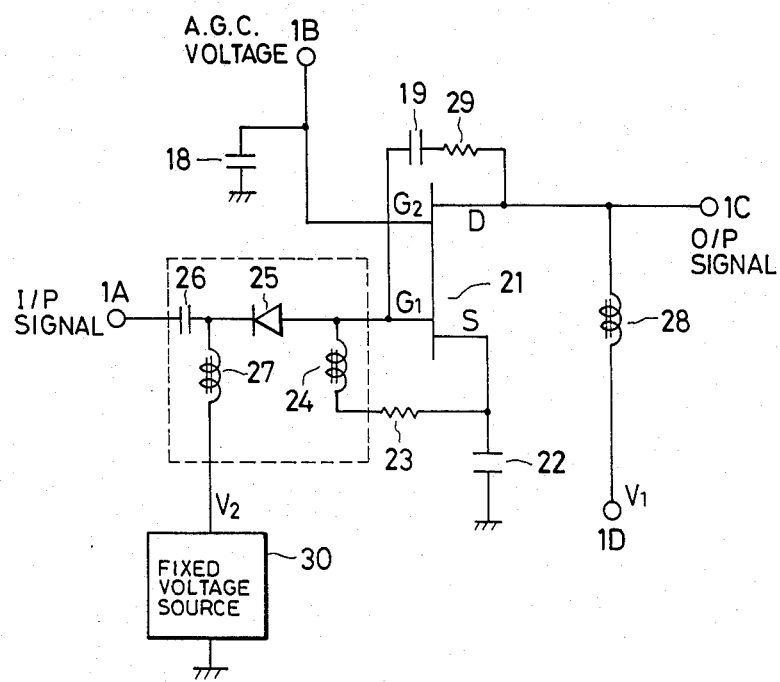
FIG. 4 is a circuit diagram of a first embodiment of a high frequency amplifier circuit according to the present invention.

FIG. 4 shows a first embodiment of the invention, whch is a specific circuit configuration of the circuit of FIG. 3. In FIG. 4, numeral 21 denotes a dual-gate FET which serves as an amplifier transistor, 22 and 18 denote by-pass capacitors, 26 denotes a coupling capacitor, 19 denotes a feedback capacitor, 29 denotes a feedback resistor, 27, 24 and 28 are choke coils each of which serves both as a load and as a high frequency blocking means. Numeral 25 denotes an input signal attenuator diode, 30 denotes a fixed voltage source, 1A denotes a high frequency signal input terminal, 1B denotes an A.G.C. voltage input terminal, 1C a high frequency signal output terminal, and 1D a supply voltage terminal which is coupled to a supply voltage $V_1$.

Figure 5:
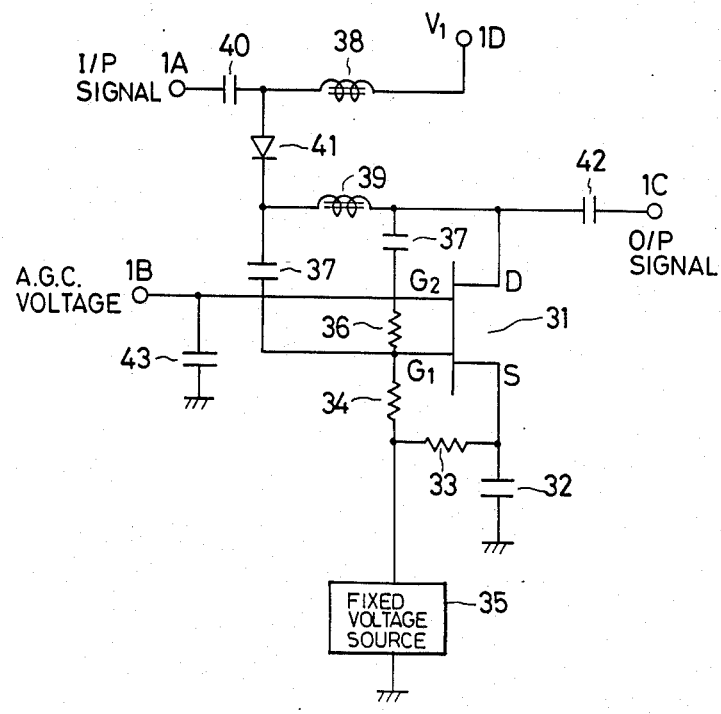
FIG. 5 is a circuit diagram of a second embodiment of a high frequency amplifier circuit according to the present invention.

FIG. 5 shows a second embodiment of a high frequency amplifier circuit according to the present invention, in which numeral 31 denotes a dual-gate FET serving as an amplifier transistor, 32 and 43 denote by-pass capacitors, 40, 37 and 42 denote coupling capacitors, 33, 34 and 36 denote bias resistors, 41 denotes a signal attenuator diode, 338 and 39 denote choke coils, 35 denotes a fixed voltage source, 1A denotes a high frequency signal input terminal, 1B an A.G.C. voltage input terminal, 1C a high frequency signal output terminal, 1D a supply voltage terminal which is coupled to a supply voltage $V_1$.

Figure 6:
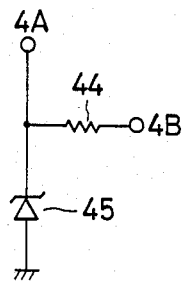
FIG. 6 and FIG. 7 show examples of circuits for use as fixed voltage sources used in the embodiments of FIGS. 4 and 5.
Figure 7:
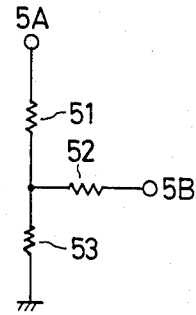

FIG. 6 shows a first example of a specific circuit for implementing the fixed voltage source 30 in FIG. 4 and 35 in FIG. 5. In FIG. 6, 44 denotes a bias resistor, 45 a zener diode, 4A an output terminal from which a fixed voltage is produced, and 4B a power supply terminal. FIG. 6 shows a second example of a specific circuit for implementing the fixed voltage source 30 in FIG. 4 and 35 in FIG. 5. In FIG. 7, 51, 52 and 53 are bias resistors, 5A denotes an output terminal and 5B a power supply terminal.

The basic principles of operation of a high frequency amplifier circuit according to the present invention will first be described referring to FIG. 3. A high frequency input is is applied from input terminal 1A to the attenuator circuit 16 and is passed through the diode within the attenuator circuit 16. The attenuator circuit 16 executes attenuation of the input signal by control of the level of DC current which is caused to flow through the diode. The manner in which this attenuation by the diode varies in accordance with the diode DC operating current. When this current is reduced below approximately 0.6 mA, the diode attenuation rapidly increases. The operating current of the transistor within the high frequency amplifier circuit 17 is passed through the path 15, whereby the operating current of the diode is increased or decreased in accordance with the operating current of the transistor. The curve of the gain reduction/A.G.C. voltage characteristic of the high frequency amplifier circuit 17 is relatively gradual. However as a result of controlling the diode operating current by the transistor operating current in this way, an overall gain reduction/A.G.C. characteristic can be obtained which varies substantially more rapidly with respect to variation of the A.G.C. voltage. Thus, the overall gain reduction/A.G.C. voltage characteristic of the combination of circuits 16 and 17 shown in FIG. 3 is initially (i.e. with a low value of A.G.C. voltage applied) determined by control which is executed by the high frequency amplifier circuit 17. When a certain degree of gain reduction is exceeded (for example in the example of FIG. 8, 15 dB), the operation of the attenuator circuit 16 causes the overall gain reduction/A.G.C. voltage characteristic to rise more steeply. As a result, gain reduction by an additional 20 to 30 dB beyond the 15 dB reduction mentioned above can be attained, due to the action of the attenuator circuit 16. In this range of additional 20 to 30 dB gain reduction, the overall cross modulation characteristic of the circuit is essentially determined by the cross modulation of the attenuator circuit 16. If a PIN diode is used as the attenuator diode in the attenuator circuit 16, then the degree of cross modulation rejection can be held to a value of greater than 110 dB (with 75Ω termination).

Figure 8:
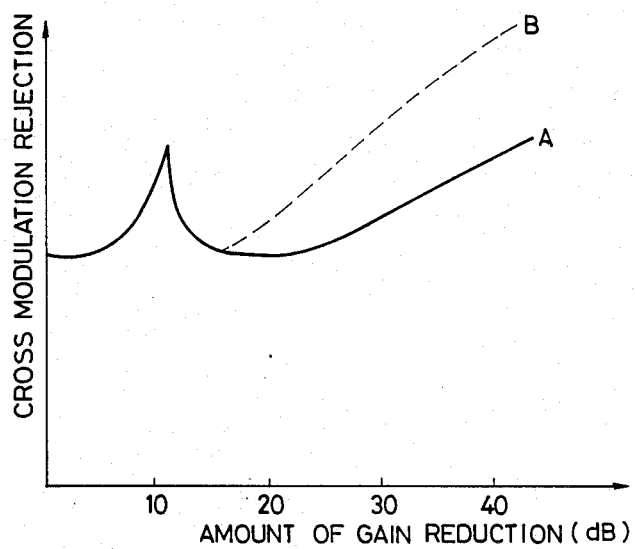
FIG. 8 graphically illustrates a gain reduction/cross modulation characteristic of a high frequency amplifier circuit according to the present invention.
Figure 9:
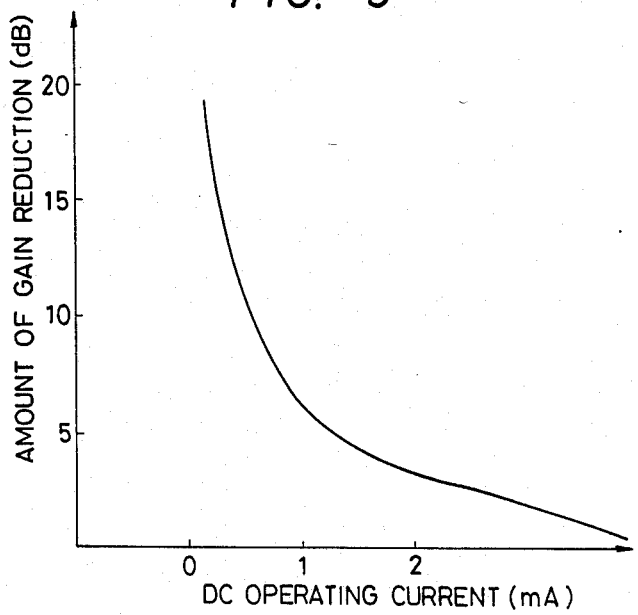
FIG. 9 shows an attenuation/operating current characteristic of a diode.

FIG. 8 illustrates the improvement in cross modulation rejection performance which is attained by a high frequency amplifier circuit according to the present invention. In FIG. 8, amounts of gain reduction (i.e. produced by applying an A.G.C. voltage) are plotted along the horizontal axis, and cross modulation rejection performance (i.e. levels of cross modulation interference power, measured by detection of cross modulation) along the vertical axis. FIG. 9 is a graph showing the attenuation characteristic, with respect to DC diode current, for a diode used in a high frequency amplifier circuit according to the present invention.

As shown in FIG. 8, the overall gain reduction/cross modulation characteristic of the circuit is (above approximately 15 dB of gain reduction) the broken-line curve denoted as B, whereas the gain reduction/cross modulation characteristic of the high frequency amplifier circuit 17 alone (i.e. controlled only by the transistor) is denoted as curve A. In this way the objective of the present invention set out hereinabove is attained, i.e. to obtain a lower degree of cross modulation at high values of gain reduction than is possible with the prior art. In the embodiment of the present invention shown in FIG. 4, which is based on the circuit of FIG. 3, a high frequency input signal is applied to the input terminal 1A, and is transferred through the coupling capacitor 26 to the cathode of the diode 25, which is utilized for gain control. A DC operating current is supplied to the diode 25 through the HF choke coils 27 and 24, and flows to the fixed voltage source 30. The degree of signal attenuation that is produced by the diode 25 is controlled by the level of this DC current, with the attenuation characteristic being as shown in FIG. 9 and described hereinabove. The input signal that has passed through the diode 25 is applied to the first gate electrode $G_1$ of the dual-gate FET 21, while the source electrode S of FET 21 is by-passed with respect to AC by the capacitor 22, and the DC operating component of the current which flows through the source electrode S is thereby transferred through the resistor 23 and choke coil 24 to the diode 25. A small degree of voltage drop occurs across the resistor 23, and this voltage is applied to the first gate electrode $G_1$ of transistor 21, to thereby apply DC feedback of the source current of transistor 21 and thereby stabilize the DC operating point. A feedback circuit made up of the feedback capacitor 19 and the feedback resistor 29 is connected between the drain electrode D and the first gate electrode $G_1$ of FET 21, to thereby lower the input and output impedances of FET 21 and ensure, wideband amplification. If at least one of the input and output of the high frequency amplifier circuit includes a tuned circuit, then there it will generally be possible to omit the latter feedback circuit.

The drain electrode D of FET 21 is supplied with a DC voltage which is applied through the choke coil 28 from the supply voltage terminal 1D. A high frequency output signal is produced from the output terminal 1C, to be supplied to a succeeding circuit stage. An A.G.C. voltage is supplied to input terminal 1B and hence to the second gate electrode $G_2$ of FET 21. This A.G.C. voltage controls the DC operating current of FET 21, to thereby execute reverse A.G.C. operation. As the DC operating current of transistor 21 becomes reduced by the action of this A.G.C. voltage, the operating current of the diode 25 is also reduced, whereby the combined gain reduction operation by diode 25 and transistor 21, described hereinabove with reference to FIG. 3, is achieved.

With the embodiment of the present invention of FIG. 4, the DC operating current of a dual gate FET 21 (i.e. the source current of the transistor) is also utilized as the operating current of a signal attenuation control diode 25. The input signal is transferred through the diode 25 to be amplified by FET 21, and by controlling the voltage which is applied to the second gate electrode of FET 21, gain control is executed simultaneously by the transistor 21 and diode 25. In addition, use is made of the difference between the respective characteristics of gain reduction versus operating current of transistor 21 and diode 25, such as to automatically delay the start of attenuation operation by the diode 25 with respect to gain reduction by the transistor (i.e. to ensure that effective attenuation by the diode begins only after a specific amount of gain reduction has been achieved by reduction of the operating current of the transistor).

As an auxiliary advantage, variations in the input capacitance of FET 21 during gain reduction control operation are reduced. Moreover, since gain reduction control is executed by FET 21 when the high frequency amplifier circuit is operating in a condition close to maximum gain, deterioration of the noise factor during gain reduction control in that region is significantly reduced.

The operation of the second embodiment of the present invention, shown in FIG. 4, is as follows. In this embodiment, a high frequency input signal is applied to input terminal 1A, and is transferred through the coupling capacitor 40 to the cathode of the diode 41. The anode of the diode 41 is connected to a power supply terminal 1D through the choke coil 38. The cathode of diode 41 is connected to the drain electrode D of transistor 31 through the choke coil 39, and is also connected through the coupling capacitor 37 to the first gate electrode $G_1$ of transistor 31. The source electrode S of transistor 31 is coupled to ground through the by-pass capacitor 32, and the DC component of the source current of transistor 31 is thereby transferred through the resistor 33 to the fixed voltage source 35. The voltage drop which is produced across resistor 33 is applied through resistor 34 to the first gate electrode $G_1$ of transistor 31 as a bias potential.

The input signal passes through the diode 41 to be amplified by transistor 31, and the resultant amplified high frequency signal is transferred through the coupling capacitor 42 to the output terminal 1C. The second gate $G_2$ of transistor 31 is coupled to receive the A.G.C. voltage from input terminal 1B, to thereby control the gain of transistor 31 by controlling the transistor operating current, while at the same time controlling the degree of attenuation produced by diode 41 by control of the diode operating current. The basic operation is as described hereinabove with reference to FIG. 3. A feedback circuit consisting of the resistor 36 and capacitor 37 is connected between the first gate electrode $G_1$ and drain electrode D of transistor 31, as for the embodiment of FIG. 4 described above. Also as stated above, it may be possible to omit this feedback circuit if a tuned circuit is coupled at the input or output of the high frequency amplifier circuit.

The second embodiment of FIG. 5 provides the same advantages as described above for the first embodiment of the invention, and has the further advantage of requiring one choke coil less than the first embodiment.

With the embodiments of high frequency amplifier circuits according to the present invention described above, a single current is passed through both a diode and a transistor and is controlled to execute gain control of an input signal which is passed through the diode to be amplified by the transistor. A single gain control voltage which is applied to the transistor thereby serves to produce gain control by both the diode and the transistor. The onset of gain reduction control by the diode is automatically delayed with respect to gain control by the transistor, whereby an improvement of the cross modulation characteristic is achieved during gain reduction control operation. That is to say, when a high degree of gain reduction is being produced as a result of attenuation by the diode, the amplitude of the high frequency signal which is transferred from the diode to the transistor is small, so that cross modulation resulting from the transistor operation will be small.

Figure 1:
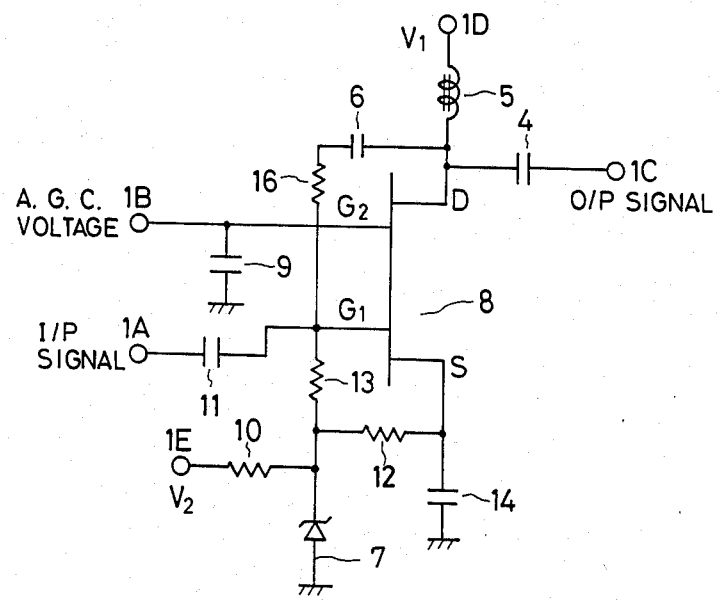
FIG. 1 is a circuit diagram of an example of a prior art high frequency amplifier circuit based on a dual-gate FET.
Figure 2:
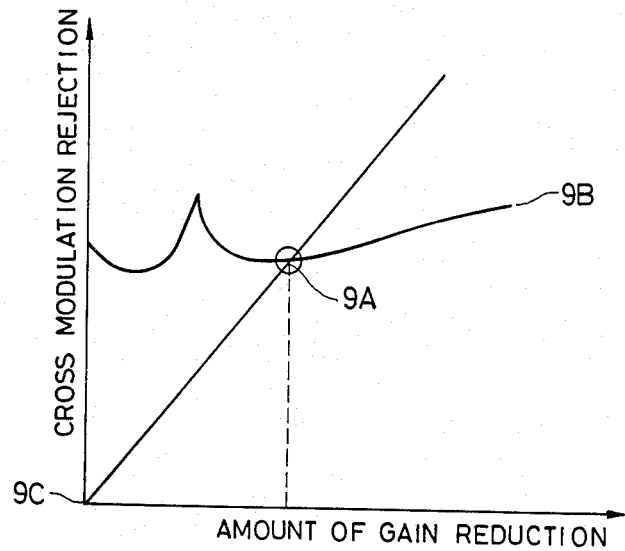
FIG. 2 graphically illustrates a gain reduction/cross modulation characteristic of the prior art example of FIG. 1.

It will be apparent from a comparison of the gain reduction/cross modulation characteristic of the prior art high frequency amplifier circuit shown in FIG. 2 with that of a high frequency amplifier circuit according to the present invention, i.e. characteristic B in FIG. 8, that the present invention provides a substantially greater degree of cross modulation suppression when A.G.C. control is being executed with a high degree of gain reduction, e.g with gain reduction of more than approximately 15 dB. The present invention therefore effectively overcomes the disadvantage of a prior art type of FET-based high frequency amplifier circuit described hereinabove.

What is claimed is:

1. A high frequency amplifier circuit comprising:
    a transistor having an input electrode and having a gain control electrode which is coupled to receive a gain control DC voltage for controlling a DC operating current of said transistor to thereby control a degree of gain of said transistor in accordance with the level of said DC operating current;

a diode coupled between said input electrode of said transistor and a source of an input high frequency signal, for transferring said input signal to said transistor input electrode while applying a degree of attenuation to said input signal during said transfer which is determined in accordance with a level of a DC operating current of said diode; and high frequency blocking means coupled to pass at least a part of said DC operating current of said transistor through said diode as said DC operating current of said diode.

2. A high frequency amplifier circuit according to claim 1, in which said high frequency blocking means comprise at least one choke coil connected between an electrode of said transistor and said diode.

3. A high frequency amplifier circuit according to claim 1, in which said transistor is a dual-gate field effect transistor having a first gate electrode which functions as said input electrode, and a second gate electrode which functions as said control electrode.

4. A high frequency amplifier circuit according to claim 3, in which at least a part of a source current of said field effect transistor flows through said diode.

5. A high frequency amplifier circuit according to claim 3, in which at least a part of a drain current of said field effect transistor flows through said diode.

6. A high frequency amplifier circuit according to claim 1, in which commencement of reduction of gain of said high frequency amplifier circuit by attenuation action of said diode is delayed with respect to a reduction of gain of said high frequency amplifier circuit resulting from gain control action of said transistor.

* * * * *